a1

(12) United States Patent
Kikuchi et al.

(10) Patent No.: US 6,867,150 B2
(45) Date of Patent: Mar. 15, 2005

(54) OZONE TREATMENT METHOD AND OZONE TREATMENT APPARATUS

(75) Inventors: Tatsuo Kikuchi, Amagasaki (JP); Takeo Yamanaka, Amagasaki (JP); Yukitaka Yamaguchi, Amagasaki (JP); Tokiko Kanayama, Amagasaki (JP)

(73) Assignee: Sumitomo Precision Products Co., Ltd., Amagasaki (JP)

( * ) Notice: Subject to any disclaimer, the term of this patent is extended or adjusted under 35 U.S.C. 154(b) by 124 days.

(21) Appl. No.: 10/312,560

(22) PCT Filed: Mar. 18, 2002

(86) PCT No.: PCT/JP02/02563

§ 371 (c)(1), (2), (4) Date: Jan. 10, 2003

(87) PCT Pub. No.: WO03/079426

PCT Pub. Date: Sep. 25, 2003

(65) Prior Publication Data

US 2004/0040582 A1 Mar. 4, 2004

(51) Int. Cl.[7] ................................................. H01L 21/31
(52) U.S. Cl. .................... 438/778; 438/781; 438/782; 438/763; 438/770; 438/692; 430/329
(58) Field of Search .................. 438/778, 781, 438/782, 763, 692, 770; 430/329; 257/E21.228, 40, E27.226

(56) References Cited

U.S. PATENT DOCUMENTS 6,517,998 B1 * 2/2003 Noda et al. ................ 430/329
6,517,999 B1 * 2/2003 Oya et al. .................. 430/329
2002/0115025 A1 * 8/2002 Noda et al. ................ 430/329

FOREIGN PATENT DOCUMENTS

| JP | 04-307734 | 10/1992 |
| JP | 04-320334 | 11/1992 |
| JP | 05-166718 | 7/1993 |
| JP | 2000-150349 | 5/2000 |

\* cited by examiner

*Primary Examiner*—Matthew Smith
*Assistant Examiner*—Belur Keshavan
(74) *Attorney, Agent, or Firm*—Westerman, Hattori, Daniels & Adrian, LLP

(57) ABSTRACT

The invention concerns an ozone treatment method and an ozone treatment apparatus for performing a treatment such as the formation and reformation of an oxide film, the removal of a resist film by blowing an ozone gas onto a surface of a substrate such as a semiconductor substrate or liquid crystal substrate. The ozone treatment apparatus 1 includes: a placement table 20 on which the substrate K is placed; a heating unit for heating the substrate K placed on the placement table 20; an opposed plate 40, disposed opposite the substrate K, for discharging the ozone gas through a discharge port 44 formed in a surface facing the substrate K, a gas feeding means 43 for feeding the ozone gas into the discharge port 44; a lifter 30 for moving the placement table 20 up and down; and a control unit 35 for controlling the operation of said lifter 30. During the discharge of the ozone gas, the control unit 35 operates the lifter 30 so as to vary the spacing g between the opposed plate 40 and the substrate K placed on the placement table 20.

14 Claims, 3 Drawing Sheets

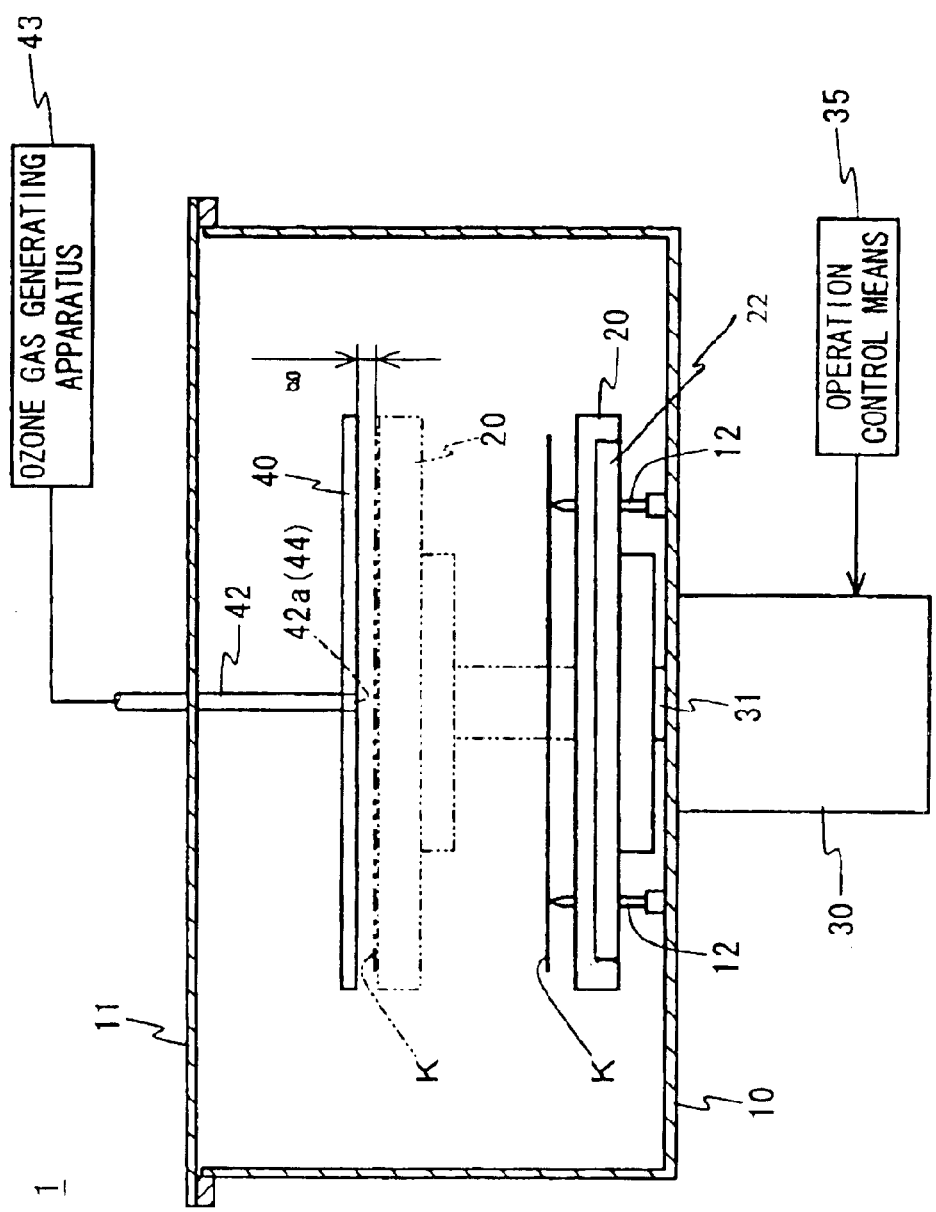

FIG. 2

| PROCESS | POSITION | SPEED (mm/min) |
|---|---|---|
| 1ST ASCENDING STEP | FROM LOWER END POSITION TO POSITION OF SPACING g = 3 mm | 1200 |
| 2ND ASCENDING STEP | FROM POSITION OF SPACING g = 3 mm TO POSITION OF SPACING g = 2 mm | 6 |
| 3RD ASCENDING STEP | FROM POSITION OF SPACING g = 2 mm TO POSITION OF SPACING g = 1 mm | 3 |
| FINAL ASCENDING STEP | FROM POSITION OF SPACING g = 1 mm TO POSITION OF SPACING g = 0.5 mm (UPPER END POSITION) | 1 |
| DESCENDING STEP | FROM UPPER END POSITION TO LOWER END POSITION | 1200 |

OZONE TREATMENT METHOD AND OZONE TREATMENT APPARATUS

TECHNICAL FIELD

The present invention relates to an ozone treatment method and an ozone treatment apparatus wherein a treatment gas containing at least ozone is blown onto a surface of a substrate such as a semiconductor substrate or liquid crystal substrate for the purpose of forming an oxide film on the substrate surface or of reforming the oxide film formed on the substrate surface or removing the resist film formed on the substrate surface.

BACKGROUND ART

Prior known examples of the above ozone treatment apparatus include the ashing apparatus disclosed in Japanese Unexamined Patent Publication No. 5-166718. As shown in FIG. 3, the ashing apparatus 100 comprises a placement table 101 on the upper surface of which a wafer W is placed, a transparent quartz plate 102 disposed above the wafer W by being spaced a prescribed distance g away from the surface of the wafer W, a nozzle 103 disposed with its one end opening in the surface of the quartz plate 102 that faces the wafer W, and a plurality of UV lamps 104 arranged above the quartz plate 102.

The placement table 101, the quartz plate 102, the nozzle 103, and the UV lamps 104 are arranged inside a chamber (not shown) having a closed space. The placement table 101 contains a heater 105, and the nozzle 103 is connected to an ozone gas generating apparatus (not shown).

According to the thus constructed ashing apparatus 100, the wafer W placed on the upper surface of the placement table 101 is heated to a predetermined temperature by the heater 105, and an ozone gas (treatment gas) of predetermined concentration generated by the ozone gas generating apparatus (not shown) is discharged from the nozzle 103 toward the heated wafer W.

The thus discharged ozone gas impinges on the wafer W and forms an ozone gas layer flowing along the surface thereof, while being exposed to UV rays from the UV lamps 104. While the gas is flowing, the ozone ($O_3$) is heated by the wafer W and, by thus being heated and contacting the wafer W and resist, or by being exposed to UV rays from the UV lamps 104, the ozone is decomposed into oxygen ($O_2$) and active oxygen ($O^*$), and the resist film formed on the surface of the wafer W is removed by thermochemical reaction with the active oxygen.

Here, the quartz plate 102 is provided to control the flow velocity of the ozone gas stream flowing along the surface of the wafer W; that is, when the spacing g with respect to the wafer W is reduced, the layer thickness of the ozone gas stream decreases and the flow velocity increases, so that the surface of the wafer W, even portions thereof farther from the nozzle 103, can be treated efficiently, that is, the surface area that can be treated increases.

On the other hand, when the spacing g is increased, the layer thickness of the ozone gas stream increases and the flow velocity decreases, as a result of which portions farther from the nozzle 103 may remain untreated, that is, the surface area of the wafer W that can be treated decreases.

Accordingly, it is preferable to set the spacing g as small as possible so that the treatment can be performed efficiently over the large surface area.

However, when the flow velocity of the ozone gas stream is increased by decreasing the spacing g, if this condition is maintained for more than a certain length of time, the portion directly below the nozzle 103 and its neighboring portions on the surface of the wafer W are cooled by the high-velocity ozone gas stream, and its surface temperature drops, suppressing the ozone gas decomposition on the affected portions. This has resulted in uneven treatment or no treatment of the cooled surface portions of the wafer W. If the occurrence of such unevenly treated or untreated portions is to be prevented, it has been necessary to perform the treatment for an extended period of time.

The present invention has been devised in view of the above situation, and an object of the invention is to provide an ozone treatment method and an ozone treatment apparatus that can uniformly treat the substrate surface in a short time.

DISCLOSURE OF THE INVENTION

The present invention concerns an ozone treatment method for treating a surface of a substrate by discharging, from a discharge port formed in an opposed plate disposed opposite the substrate, an ozone-containing treatment gas onto the substrate placed on a placement table, while heating the substrate by a heating means, wherein the spacing between the opposed plate and the substrate placed on the placement table is varied during the discharge of the treatment gas.

The above ozone treatment method can be implemented advantageously by the following apparatus invention. That is, the apparatus invention concerns an ozone treatment apparatus comprising: a placement table which a substrate is placed thereon; a heating means for heating the substrate placed on the placement table; an opposed plate disposed opposite the substrate placed on the placement table, and having a discharge port opening in one surface thereof facing the substrate, for discharging therethrough an ozone-containing treatment gas toward the substrate; a gas feeding means for feeding the treatment gas into the discharge port formed in the opposed plate and thereby causing the treatment gas to be discharged from the discharge port; a lift means for moving the placement table and the opposed plate closer to/away from each other by moving the placement table and/or the opposed plate up and down; and a control means for controlling the operation of the lift means, and wherein: during the discharge of the treatment gas, the control means operates the lift means so as to vary the spacing between the opposed plate and the substrate placed on the placement table.

According to the present invention, the ozone-containing treatment gas is fed by the gas feeding means, and the thus fed treatment gas is discharged toward the substrate from the discharge port formed in the opposed plate disposed opposite the substrate placed on the placement table. Further, the substrate is heated by the heating means.

The treatment gas discharged from the discharge port impinges on the substrate and forms a treatment gas layer flowing along the surface thereof, and while the gas is flowing, the ozone ($O_3$) is heated by the substrate; by thus being heated and contacting the substrate and resist, the ozone is decomposed into oxygen ($O_2$) and active oxygen ($O^*$) and, with this active oxygen ($O^*$), an oxide film is formed on the substrate surface or the oxide film formed on the substrate surface is reformed, or the resist film formed on the substrate surface is removed by thermochemical reaction with the active oxygen.

As previously described, the opposed plate is provided to control the flow velocity of the treatment gas stream flowing along the substrate surface, and when the spacing between the substrate and the opposed plate is reduced, the layer thickness of the treatment gas stream decreases and the flow velocity increases; on the other hand, when the spacing is increased, the layer thickness of the treatment gas stream increases and the flow velocity decreases.

When the flow velocity of the treatment gas stream is slow, there arises the problem that portions farther from the discharge port cannot be treated, resulting in an inability to treat the large surface of the substrate surface. On the other hand, when the flow velocity of the treatment gas stream is increased by decreasing the spacing, there arises the problem that if this condition is maintained for more than a certain length of time, the portion directly below the discharge port and its neighboring portions on the substrate surface are cooled by the low-velocity treatment gas stream, and its surface temperature drops, suppressing the ozone gas decomposition on the affected portions and thus causing unevenly treated or untreated portions on the substrate surface, or the treatment has to be performed for an extended period of time in order to prevent the occurrence of such unevenly treated or untreated portions.

In view of this, in the present invention, the spacing between the opposed plate and the substrate placed on the placement table is varied during the discharge of the treatment gas.

In one mode for varying the spacing, the substrate and the opposed plate may be moved closer to each other in such a manner as to gradually close the spacing between them; in this case, the closing speed may be decreased progressively or in a steplike manner.

By so doing, in the early stage where the spacing between the substrate and the opposed plate is relatively large, the portion directly below the discharge port and its neighboring portions on the substrate surface can be reliably treated, though the area that can be treated is small, and thereafter, by gradually closing the spacing between the substrate and the opposed plate and thereby increasing the flow velocity of the gas stream, the treatment area is gradually increased, as a result of which the large surface area of the substrate can be treated. In this way, by gradually closing the spacing between the substrate and the opposed plate, the large surface of the substrate can be treated uniformly and in a short time.

Further, the substrate and the opposed plate may be moved closer to/away from each other in a periodic or non-periodic manner so as to vary the spacing between them in a periodic or non-periodic manner; in this case, the closing speed may be decreased progressively or in a steplike manner. In this case also, the same effect as described above can be achieved.

Preferably, the heating temperature of the substrate is in the range of 200° C. to 500° C. Within this range, impurities contained in the substrate can be evaporated during the above treatment. Also preferably, the treatment gas contains 14% or more of ozone by weight, and a mixture gas of ozone and TEOS (tetraethyl orthosilicate, $Si(C_2H_5O)_4$) may be used.

BRIEF DESCRIPTION OF THE DRAWINGS

FIG. 1 is a sectional view showing a preferred mode of an ozone treatment apparatus according to the present invention, and FIG. 2 is an explanatory diagram for explaining the relationship between the positions to which a placement table is moved up and the speeds with which the placement table is moved up.

BEST MODE FOR CARRYING OUT THE INVENTION

Figure 3:
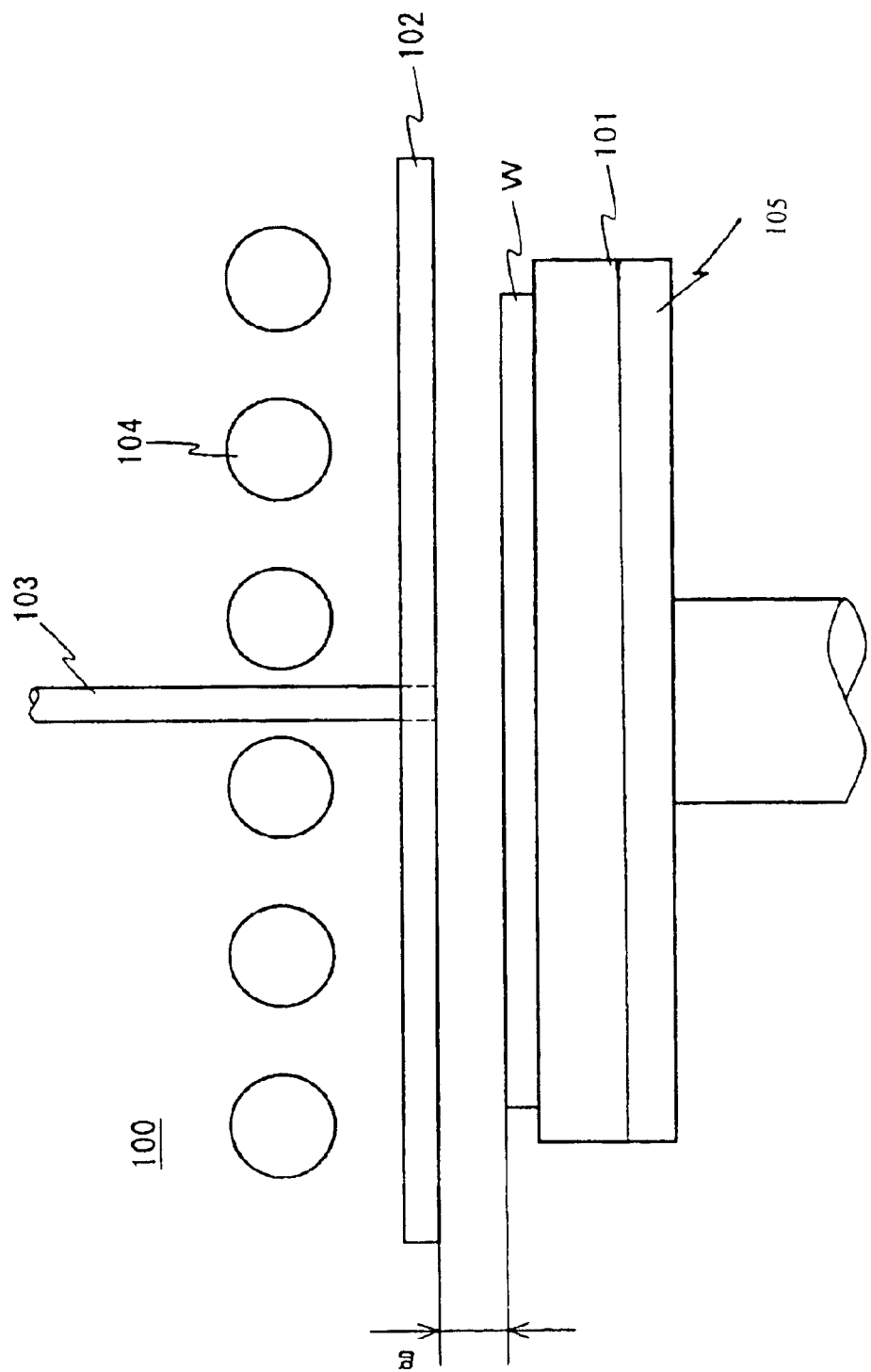
FIG. 3 is a front view showing a portion of an ozone treatment apparatus according to the prior art.

The present invention will be described in further detail below with reference to the accompanying drawings.

As shown in FIG. 1, the ozone treatment apparatus 1 according to the present invention comprises a treatment chamber 10 having a prescribed internal volume, a placement table 20 which disposed inside the treatment chamber 10 and which a substrate K is placed on the upper surface thereof, a lift means 30 for moving the placement table 20 up and down, a control means 35 for controlling the operation of the lift means 30, and an opposed plate 40 positioned above the placement table 20.

The treatment chamber 10 is constructed so that it is closed with a lid member 11, and so that gases inside the treatment chamber 10 are exhausted as needed to the exterior through an outlet port (not shown). The treatment chamber 10 has a load/unload opening (not shown) through which the substrate K is loaded into or unloaded from the treatment chamber 10.

Further, a plurality of supporting needles 12 each having a sharpened end are arranged standing vertically on the bottom of the treatment chamber 10, and the substrate K loaded into the treatment chamber 10 through the load/unload opening (not shown) is temporarily placed on the sharpened ends of the supporting needles 12.

The placement table 20 contains a heating means 22 such as a heater, and the substrate K placed on the upper surface of the placement table 20 is heated by the heating means 22.

Further, through-holes are formed in the placement table 20, the construction being such that when the placement table 20 is at its lower end position, the supporting needles 12 pass through the through-holes (not shown) with their sharpened ends protruding upward from the upper surface of the placement table 20, but when the placement table 20 is moved upward by a prescribed distance by the lift means 30, the supporting needles 12 are disengaged from the through-holes (not shown).

Accordingly, after the substrate K is temporarily placed on the supporting needles 12 with the placement table 20 placed in its lower end position, when the placement table 20 is moved upward by the lift means 30, the supporting needles 12 recede relative to the placement table 20, and the substrate K is placed on the placement table 20.

The lift means 30 has a lifting rod 31 which is provided passing through the bottom of the treatment chamber 10, and the placement table 20 is moved upward by being supported on the lifting rod 31.

The opposed plate 40 is suitably fixed to the treatment chamber 10 in such a manner as to face the substrate K placed on the placement table 20, and has a through-hole 41 communicating between the upper surface and the lower surface of the opposed plate 40. A nozzle 42 is inserted and fixedly held in the through-hole 41 with one end of the nozzle 42 opening in the surface of the opposed plate 40 that faces the substrate K, and the nozzle 42 is connected to an ozone gas generating apparatus 43 which generates an ozone gas (treatment gas) of prescribed concentration.

The open end 42a of the nozzle 42 functions as a discharge port from which the ozone gas (treatment gas) is discharged toward the substrate K; that is, the ozone gas generated by the ozone gas generating apparatus 43 is fed into the nozzle 42 and discharged from the discharge port 44 toward the substrate K.

The control means 35 controls the operation of the lift means 30, and drives the lift means to move the placement table 20 up and down at a predetermined speed.

For example, in the present embodiment, in a first ascending step in which the placement table 20 is moved upward from its lower end position to the position at which the spacing g between the substrate K on the placement table 20 and the opposed plate 40 is 3 mm, the control means 35 drives the lift means 30 by setting the ascending speed set to 1200 mm/min; in a second ascending step in which the placement table 20 is moved upward to the position at which the spacing g is 2 mm, the ascending speed is set to 6 mm/min; in a third ascending step in which the placement table 20 is moved upward to the position at which the spacing g is 1 mm, the ascending speed is set to 3 mm/min; and in a final ascending step in which the placement table 20 is moved upward to the position (the upper end position) at which the spacing g is 0.5 mm, the ascending speed is set to 1 mm/min. On the other hand, when moving down the placement table 20 from the upper end position to the lower end position, the lift means 30 is driven with its descending speed set to 1200 mm/min.

According to the thus constructed ozone treatment apparatus 1 of the present embodiment, first the substrate K is loaded into the treatment chamber 10 through the load/unload opening (not shown) by a suitable means, and placed on the supporting needles 12. At this time, the placement table 20 is located in its lower end position.

Next, the lift means 30 is driven by the control means 35 to move the placement table 20 upward at the ascending speed of 1200 mm/mm from the lower end position to the position at which the spacing g is 3 mm (the first ascending step). When the placement table 20 is thus moved upward, the supporting needles 12 recede relative to the placement table 20, and the substrate K is placed on the placement table 20 and heated by the heating means 22.

As the placement table 20 is moved upward, the ozone gas of prescribed concentration is fed from the ozone gas generating apparatus 43 into the nozzle 42 and discharged from the discharge port 44 (42a) toward the substrate K.

Next, while the ozone gas is being discharged from the discharge port 44, the placement table 20 is moved upward at the ascending speed of 6 mm/min to the position at which the spacing g is 2 mm (the second ascending step); the placement table 20 is further moved upward by reducing the ascending speed in a steplike manner, that is, at the ascending speed of 3 mm/min up to the position where the spacing g is 1 mm (the third ascending speed), and at the ascending speed of 1 mm/min up to the position (the upper end position) at which the spacing g is 0.5 mm (the final ascending step).

In this way, the ozone gas discharged from the discharge port 44 impinges on the substrate K being moved upward, and forms an ozone gas layer flowing along the surface thereof, and while the gas is flowing, the ozone ($O_3$) is heated by the substrate K; by thus being heated and contacting the substrate K and resist, the ozone is decomposed into oxygen ($O_2$) and active oxygen ($O^*$) and, with this active oxygen ($O^*$), an oxide film is formed on the surface of the substrate K or the oxide film formed on the surface of the substrate K is reformed, or the resist film formed on the surface of the substrate K is removed by thermochemical reaction with the active oxygen.

In the early stage (for example, up to the end of the second ascending step) where the spacing g between the substrate K and the opposed plate 40 is relatively large, since the flow velocity of the ozone gas stream is slow, the portion directly below the discharge port 44 and its neighboring portions of the substrate K can be reliably treated, though the area that can be treated is small.

On the other hand, as the process progresses from the third ascending step to the final ascending step, the spacing g between the substrate K and the opposed plate 40 is gradually closed, and as the flow velocity of the ozone gas stream increases, the treatment area gradually increases, as a result of which the large surface of the substrate K can be treated.

When the substrate K has been treated sufficiently with a prescribed time having elapsed after the placement table 20 reached its upper end position, then the lift means 30 is driven by the control means 35 to lower the placement table 20 from the upper end position to the lower end position at the descending speed of 1200 mm/min (the descending step), after which the substrate K placed on the supporting needles 12 is unloaded from the treatment chamber 10 through the load/unload opening (not shown) by a suitable means.

In this way, according to the ozone treatment apparatus 1 of the present embodiment, since the spacing g between the substrate K and the opposed plate 40 is gradually closed while reducing the speed in a steplike manner, the large surface of the substrate K can be treated uniformly and in a short time.

Preferably, the heating temperature of the substrate K is in the range of 200° C. to 500° C. Within this range, impurities contained in the substrate K can be evaporated during the above treatment. Also preferably, the ozone gas contains 14% or more of ozone by weight, and a mixture gas of ozone and TEOS (tetraethyl orthosilicate, $Si(C_2H_5O)_4$) may be used.

While the invention has been described with reference to one specific embodiment, it will be appreciated that the invention is by no means limited by this specific embodiment.

For example, in the above embodiment, the control means 35 is configured to control the lift means 30 in such a manner as to reduce ascending speed of the placement table 20 in a steplike manner as the placement table 20 approaches the opposed plate 40, but alternatively, it may be configured to perform control in such a manner as to reduce the ascending speed gradually and smoothly. In that case also, the same effect as described above can be achieved.

Further, the control means 35 may be configured to close and expand the spacing g by moving the placement table 20 up and down in a periodic or non-periodic manner. By so doing, the spacing g can also be varied, and the same effect as described above can be achieved. Furthermore, in this case, the ascending speed of the placement table 20 may be reduced in a steplike manner or reduced gradually and smoothly as the placement table 20 approaches the opposed plate 40.

Further, the above embodiment has described the construction in which the placement table 20 is moved up, but alternatively, the apparatus may be constructed so that the opposed plate 40 is moved down, rather than moving up the placement table 20. Furthermore, both the placement table 20 and the opposed plate 40 may be moved up and down, moving them closer to/away from each other and thus closing/expanding the spacing between them.

Potential for Utilization in Industry

As described above, the ozone treatment method and the ozone treatment apparatus according to the present invention can be used advantageously for forming an oxide film on a surface of a substrate such as a semiconductor substrate or liquid crystal substrate, reforming the oxide film formed on the substrate surface, or removing the resist film formed on the substrate surface.

What is claimed is:

1. An ozone treatment method for treating a surface of a substrate by discharging, from a discharge port formed in an opposed plate disposed opposite said substrate, an ozone-containing treatment gas onto said substrate placed on a placement table, while heating said substrate by a heating means, wherein spacing between said opposed plate and said substrate placed on said placement table is varied during the discharge of said treatment gas.

2. An ozone treatment method as set forth in claim 1, wherein said substrate and said opposed plate are moved closer to each other in such a manner as to gradually close the spacing between said substrate and said opposed plate.

3. An ozone treatment method as set forth in claim 2, wherein closing speed between said substrate and said opposed plate is decreased gradually.

4. An ozone treatment method as set forth in claim 3, wherein closing speed between said substrate and said opposed plate is decreased in a steplike manner.

5. An ozone treatment method as set forth in claim 1, wherein said substrate and said opposed plate are moved closer to/away from each other in a periodic or non-periodic manner so as to vary the spacing between said substrate and said opposed plate in a periodic or non-periodic manner.

6. An ozone treatment method as set forth in claim 5, wherein closing speed between said substrate and said opposed plate is decreased gradually.

7. An ozone treatment method as set forth in claim 6, wherein closing speed between said substrate and said opposed plate is decreased in a steplike manner.

8. An ozone treatment apparatus comprising:

a placement table which a substrate is placed thereon;

a heating means for heating said substrate placed on said placement table;

an opposed plate disposed opposite said substrate placed on said placement table, and having a discharge port opening in one surface thereof facing said substrate, for discharging therethrough an ozone-containing treatment gas toward said substrate;

a gas feeding means for feeding said treatment gas into said discharge port formed in said opposed plate and thereby causing said treatment gas to be discharged from said discharge port;

a lift means for moving said placement table and said opposed plate closer to/away from each other by moving said placement table and/or said opposed plate up and down; and a control means for controlling operation of said lift means, and wherein:

during the discharge of said treatment gas, said control means operates said lift means so as to vary spacing between said opposed plate and said substrate placed on said placement table.

9. An ozone treatment apparatus as set forth in claim 8, wherein said control means controls the operation of said lift means so that said substrate and said opposed plate are moved closer to each other in such a manner as to gradually close the spacing between said substrate and said opposed plate.

10. An ozone treatment apparatus as set forth in claim 9, wherein said control means controls the operation of said lift means in such a manner that closing speed between said substrate and said opposed plate decreases gradually.

11. An ozone treatment apparatus as set forth in claim 10, wherein said control means controls the operation of said lift means in such a manner that closing speed between said substrate and said opposed plate decreases in a steplike manner.

12. An ozone treatment apparatus as set forth in claim 8, wherein said control means controls the operation of said lift means so that said substrate and said opposed plate are moved closer to/away from each other in a periodic or non-periodic manner so as to vary the spacing between said substrate and said opposed plate in a periodic or non-periodic manner.

13. An ozone treatment apparatus as set forth in claim 12, wherein said control means controls the operation of said lift means in such a manner that closing speed between said substrate and said opposed plate decreases gradually.

14. An ozone treatment apparatus as set forth in claim 13, wherein said control means controls the operation of said lift means in such a manner that closing speed between said substrate and said opposed plate decreases in a steplike manner.

* * * * *